United States Patent [19]

Muterspaugh

[11] Patent Number: 4,481,673
[45] Date of Patent: Nov. 6, 1984

[54] RF PROM TRACKING FOR TUNERS
[75] Inventor: Max W. Muterspaugh, Indianapolis, Ind.
[73] Assignee: RCA Corporation, New York, N.Y.
[21] Appl. No.: 479,447
[22] Filed: Mar. 28, 1983
[51] Int. Cl.³ ............................................. H04B 1/26
[52] U.S. Cl. .................................. 455/180; 455/186; 455/197; 455/340
[58] Field of Search ............... 455/179, 180, 185, 186, 455/191, 195, 196, 197, 340; 358/191.1

[56] References Cited

U.S. PATENT DOCUMENTS

| | | | |
|---|---|---|---|
| 3,835,424 | 9/1974 | Marik | 334/87 |
| 4,334,323 | 6/1982 | Moore | 455/179 |
| 4,402,089 | 8/1983 | Knight et al. | 455/186 |
| 4,408,348 | 10/1983 | Theriault | 455/180 |
| 4,418,427 | 11/1983 | Muterspaugh | 455/180 |
| 4,418,428 | 11/1983 | Evans | 455/180 |

FOREIGN PATENT DOCUMENTS 2814577 11/1979 Fed. Rep. of Germany .

OTHER PUBLICATIONS

The Cheap Video Cookbook by Don Lancaster, Published by Howard W. Samms and Co. in 1978, pp.40 to 42.

Primary Examiner—Jin F. Ng
Attorney, Agent, or Firm—Eugene M. Whitacre; Paul J. Rasmussen; Peter M. Emanuel

[57] ABSTRACT

A tuning system for a receiver includes an RF filter for selecting the RF signal corresponding to a selected channel of a plurality of channels in response to a filter tuning control signal, a local oscillator for developing an oscillator signal, the frequency of which is controlled by an oscillator tuning control signal developed in response to a binary coded representation of the channel number of the selected selection, and a mixer for heterodyning the selected RF signal with the local oscillator signal to produce an IF signal. A circuit including a memory is provided for storing binary signals for controlling the modification of the oscillator tuning control signal to derive the filter tuning control signal. Since the modification needed to derive the filter tuning control signal is the same for groups of channels, the number of memory locations is less than the total number of channels and the addresses are therefore generated by coupling means responsive to the coded channel signals for supplying only a predetermined number of bits of said coded channel number representative signal to the address inputs of the memory. Since the number of modifications needed from higher number channels is less than for lower number of channels, the coupling means ignores increasing numbers of least significant bits of the coded channel number representative signal for developing the address signals, as the channel number increases.

12 Claims, 4 Drawing Figures

RF PROM TRACKING FOR TUNERS

The present invention relates to tuning systems employing a radio frequency stage and a local oscillator with respective tuned circuits which desirably track each other over a given tuning range.

Television (TV) tuning systems heterodyne a radio frequency (RF) signal corresponding to a desired channel received from broadcast or cable TV signal sources with a local oscillator (LO) signal having a frequency set in accordance with the desired channel in order to produce an intermediate frequency (IF) signal from which display and sound information is derived. In essence, due to the heterodyning process, the IF signal has a passband which includes the difference frequencies between the frequency of the LO signal and the frequencies in the passband of the RF signal. The frequency of a local oscillator signal is commonly controlled by a tuning voltage. The tuning voltage is developed in response to the selection of a channel by a viewer in any one of a variety of well known ways which may be generally characterized as either voltage synthesis or frequency synthesis. In voltage synthesis the tuning voltages for tuning each channel is stored in either analog form by means of a potentiometer or in digital form in an addressable memory. In frequency synthesis the frequency of the local oscillator or the IF signal is compared to a reference frequency and the tuning voltage is changed until the two frequencies are equal. Typically frequency synthesis is accomplished by a phase-locked loop.

In addition to tuning the local oscillator, the tuning voltage for the local oscillator (LO) can be employed to adjust the frequency selectivity of tunable RF filter circuits which precede the mixer to pass only the RF signal of the selected channel. When the passband of the RF filter circuits does not properly track the frequency of the local oscillator signal (such that the IF signal has the proper passband), the desired RF signal may be attenuated and the possibility of interference from adjacent TV channels is increased. While increasing the bandwidth of the RF filter circuits might help reduce attenuation of the desired RF signal in a case of mistracking, it could also worsen the interference problem.

Since the voltage variable capacitance ("varactor") diodes in the the RF filter and local oscillators circuits receive a common tuning voltage but do not produce precisely the same tuning characteristics over the tuning range of their respective tuned circuits (even when "matched" diodes are used), mechanically variable inductors and capacitors have been used as trimming elements in the RF filter and LO circuits to cause the frequency characteristics of these circuits to track one another in response to the tuning voltage. The adjustment of these trimming elements is difficult and time consuming, often requiring an iterative procedure. Additionally, they increase the wear and tear on the mechanical portions of the adjustable elements which increases the probability of component failure. Trimming and padding components may also reduce the overall range of frequency variation of the local oscillator to a point where a separate local oscillator is required for each TV band, i.e., low VHF, mid band cable, high VHF, super band cable and UHF bands.

U.S. patent application Ser. No. 302,853 entitled TELEVISION TUNING SYSTEM WITH ELECTRONIC FREQUENCY ADJUSTMENT APPARATUS, filed in the name of Knight et al., on Sept. 16, 1981, now U.S. Pat. No. 4,402,089 and assigned to the same assignee as the present application, relates to an electronic tracking tuning system which avoids the use of mechanical trimming and padding components and hence their disadvantages. In the TV tuning system of this U.S. patent application, a programmable read-only-memory (PROM) is responsive to viewer channel selection for electronically developing adjustment signals which are used to tune the frequency response characteristics of the RF and LO tunable circuits of the TV tune in order that they track each other for proper operation. It is disclosed in FIG. 4 of this patent that the PROM can supply adjustment signals which can be combined with the LO tuning voltage for generating tuning voltages for the RF filter stages which will track the LO tuning voltage in the prescribed manner. Additionally, it is stated that the same adjustment signal can be used for more than one channel, i.e., the same adjustment signal can be used for groups of adjacent channels. This allows the use of a PROM having fewer memory locations than the total number of channels and hence results in a cost savings for the tuning system.

The present invention relates to electronic tracking tuning apparatus with a memory for storing tracking adjustment signals and specifically for memory addressing apparatus for addressing of memory locations by respective groups of adjacent channels rather than by addressing memory locations by respective channels.

In accordance with the principles of the invention, the memory addressing means receives binary channel number representative signals and couples binary signals to the address input of the PROM, storing tracking adjustment signals with successively increasing numbers of least significant bits of the binary channel number representative signals missing as the channel number increases.

In accordance with a further aspect of the present invention, the addressing means is responsive to at least one band selection signal for selectively ignoring increasing numbers of least significant bits of the binary channel number.

In the drawings

Figure 1:
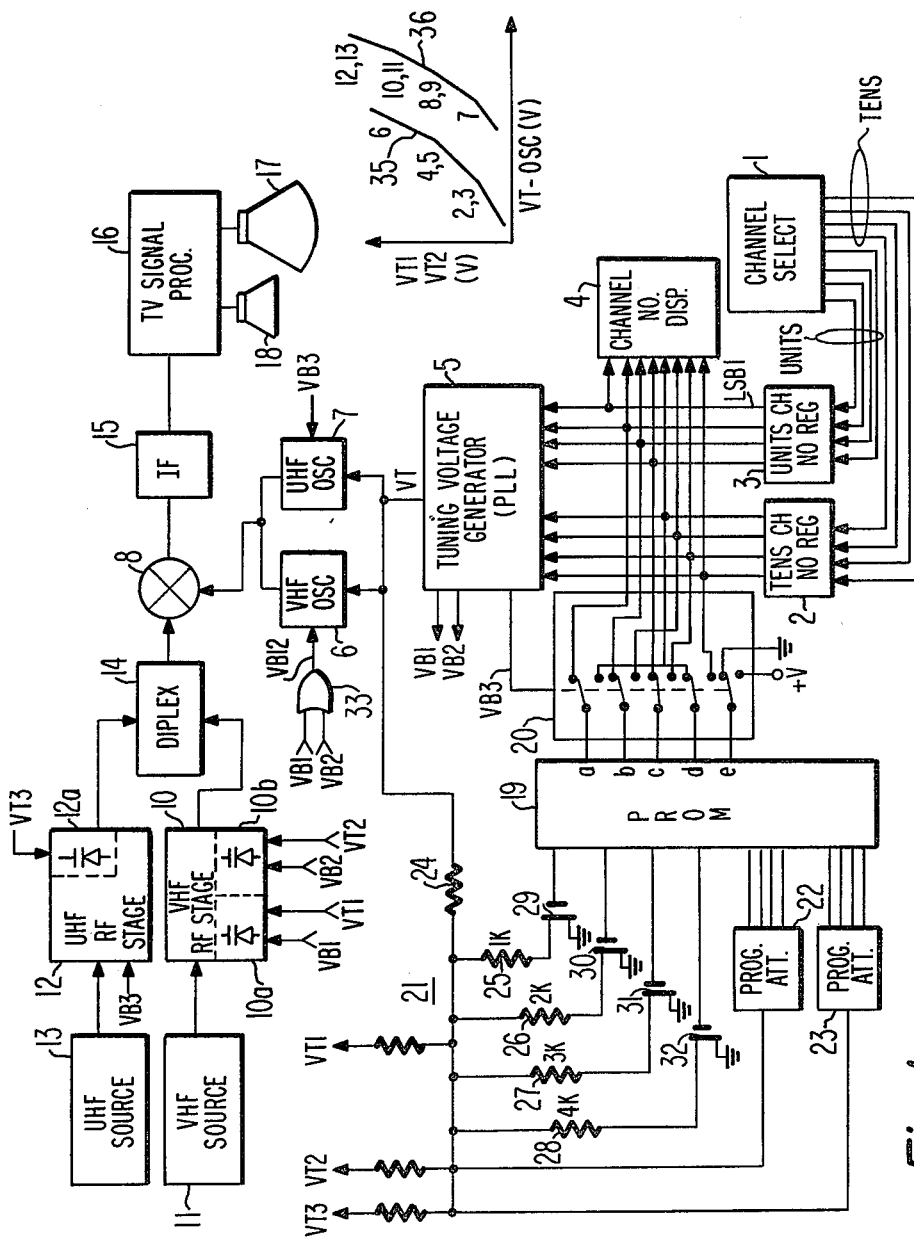
FIG. 1 illustrates, partially in block diagram form and partially in schematic diagram form, a TV receiver including an electronic tracking tuning system constructed in accordance with the principles of the present invention.

In the television receiver illustrated in FIG. 1, channels are selected by sequentially depressing the two keys or buttons of a calculator-like keyboard included in channel selector 1 representing the tens and units digits of the corresponding channel number. In response, channel selector 1 sequentially generates groups of binary signals in BCD (binary coded decimal) format representing the tens and units digits to be stored in a tens channel number register 2 and a units channel number register 3, respectively. The binary contents of channel number registers 2 and 3 are coupled to a channel number display 4 and a tuning voltage generator 5. Channel number display 4 provides a visible display of the channel number selected by the viewer in the response to the channel number representative binary signals. Tuning voltage generator 5, which may comprise any one of a number of known arrangements such as a phase-locked loop, converts the binary signals representing the selected channel number to a tuning voltage VT. The tuning voltage VT is applied to a VHF voltage controlled oscillator (VCO) 6 and a UHF VCO 7 for deriving VHF and UHF LO signals at frequencies related to the selected channel for application to a mixer 8. When tuning voltage generator 5 comprises a PLL, the LO signals are also coupled via a conductor 9 back to tuning voltage generator 5 for completing the feedback path of its phase-locked loop.

A VHF RF stage 10 receives RF signals in the low and high VHF ranges from a VHF signal source 11 such as an antenna or cable network. The RF signals in the low VHF and high VHF bands are filtered by voltage controlled tunable filters 10a and 10b, respectively, for passing the selected RF signal when the desired channel is in one of the VHF bands.

A UHF RF stage 12 receives RF signals in the UHF range from a UHF signal source 13. The UHF RF signals are filtered by a voltage controlled tunable filter 12a for passing the selected RF signal when the desired channel is in the UHF range.

Tuning voltage generator 5 selectively generates VB1, VB2 and VB3 bandswitching signals when the selected channel is in the low VHF band, the high VHF band and the UHF band, respectively. The VB1 and VB2 bandswitching signals are combined by an OR gate 33 to form a VB12 bandswitching signal when either of the VB1 or VB2 bandswitching signals is generated. The VB1, VB2 and VB3 bandswitching signals are coupled to tunable filters 10a, 10b and 12a, respectively. The VB12 and VB3 bandswitching signals are coupled to VHF LO 6 and UHF LO 7, respectively. When a low VHF band channel (2-6) is selected, VHF RF filter 10a, and VHF LO 6 are enabled to operate in response to the VB1 and VB12 bandswitching signals. When a high VHF band channel (7-13) is selected, VHF RF filter 10b and VHF LO 6 are enabled to operate in response to the VB2 and VB12 bandswitching signals. When a UHF band channel (14-83) is selected, UHF filter 12a and UHF LO 7 are enabled to operate in response to the VB3 bandswitching signal.

The RF signals passed by the enabled one of tunable RF stages 10 and 12 is applied via a diplexer (or combiner) 14 to a first input of mixer 8 and the LO signal of the enabled one of VCO's 6 and 7 is applied to a second input of mixer 8 for frequency translating the selected RF signal to a predetermined intermediate frequency (IF) signal. The IF signal is filtered and amplified by an IF section 15 and then applied to conventional TV signal processing circuitry 16 for demodulating the video and sound information of the IF signal. A kinescope 17 displays a picture in accordance with the video information and a loudspeaker 18 produces an audio response in accordance with the audio information.

Particular details of a TV tuning system including a phase-locked loop and a keyboard type channel selector, although not necessary for understanding the present invention, can be found in U.S. Pat. No. 4,031,549 entitled "Television Tuning Systems With Provision For Receiving RF Carriers at Nonstandard Frequencies", issued in the name of Robert Morgan Rast, et al., on June 21, 1977 and U.S. Pat. No. 4,282,516 entitled "Keyboard Encoding Arrangement", issued in the name of Juri Tults on Aug. 4, 1981.

Tuning control signals VT1, VT2 and VT3 for controlling the frequency selectivity of RF filter stages 10a, 10b and 12a are derived from the LO tuning voltage VT by an electronic adjustment apparatus including a programmable read-only-memory (PROM) 19 for storing tracking adjustment signals in binary form. The binary tracking adjustment signals are converted to corresponding analog signals which are combined with the LO tuning voltage VT to form filter tuning control signals VT1, VT2 and VT3. The tracking adjustment signals are set so that the filter tuning control signals cause RF stages 10a, 10b and 12a to pass RF signals such that the passband of the IF signal produced as a result of the heterodyning process of mixer 8 is correct. In other words, the frequency selectivities of RF tunable filters 10a, 10b and 12a are made to track the frequency of the LO signals.

PROM 19 comprises a nonvolatile programmable read-only-memory including a plurality of memory locations for storing the adjustment signals in the form of four-bit binary words. Selected binary digit signals ("bits") of the BCD channel number signals at the output of channel number registers 2 and 3 are applied via an addressing circuit 20 to address inputs (a) through (e) of PROM 19 for addressing appropriate memory locations in accordance with the selected channel. Address inputs (a)-(c) address rows and inputs (d) and (e) address columns of an array of five rows by four columns of memory locations in PROM 19. PROM 19 may be of the X2210 type available from Xicor, Inc., Milpitas, Calif. with suitable modification of its internal addressing circuitry to enable efficient BCD addressing of its memory locations, such as used in the scan memory integrated circuit, available from RCA Corp. Indianapolis, Ind. as stock number 1421715-3. Programmable attenuators 21, 22 and 23 receive the binary tracking adjustment signals read out of PROM 19 for developing corresponding analog tracking adjustment signals which are added to LO tuning control signal VT to develop filter tuning control signals VT1, VT2 and VT3 for the low VHF, high VHF and UHF TV frequency bands, respectively.

Programmable attenuators 21, 22 and 23 are of similar design. Each attenuator, in combination with a resistor 24 which couples LO tuning voltage VT to it, comprises a programmable voltage divider for controllably attenuating the LO tuning voltage VT.

VCO's 6 and 7 are adjusted during factory alignment in order that the voltage range for the oscillator tuning control signal VT is at least as great as the expected voltage range of the RF filter tuning control signals.

Programmable attenuator 21 includes resistors 25, 26, 27 and 28 and respective series connected FET switches 29, 30, 31, and 32. In response to channel address signals supplied by addressing circuit 20, PROM 19 provides one bit of the four-bit binary adjustment signal to the gate electrode of a respective one of the FET's of the attenuator. Depending on whether the bit coupled to an FET is a logic high or low, the FET will be rendered conductive. The LO tuning control voltage VT will be attenuated by a factor depending on which FETs are conductive and thereby determine the respective RF filter tuning control voltage.

It has been found that the same tracking adjustment voltage may be used for more than one channel, i.e., can be used for a group of channels. Thus, one memory location can be used for a group of channels.

In accordance with the principles of the present invention, addressing circuit 20 generates the address signals of PROM 19 by coupling the binary channel number representative signals to the address input of PROM 19 in a manner by which increasing numbers of the least significant bits of the binary channel number representative signals are ignored. For example, for U.S. VHF broadcast channels 2–13 only the first least significant bit (LSB1) of the BCD channel number is ignored. Thus, every two adjacent channel numbers will have an identical BCD address and therefore use the same memory location of PROM 19. This reduces the required capacity of PROM 19 by one-half. For U.S. UHF broadcast channel numbers 14–83, a greater number of least significant bits, e.g. four bits, of the binary channel number representative signals are ignored when addressing PROM 19. In this manner the same memory location will be used for groups of 16 adjacent channel numbers, reducing the required number of memory locations of PROM 19 by a factor of 16.

Specifically, addressing circuit 20 includes a plurality of switches in the coupling path of the BCD channel number lines between the outputs of channel number registers 2 and 3 and the address inputs (a)–(e) of PROM 19, for deriving the address input signal. The first least signigicant bit of the units channel number (LSBI) is not coupled to addressing circuit 20. In this manner, the same memory location will be addressed for adjacent pairs of television channels. When tuning the twelve broadcast channels in the low and high VHF bands, different adjustment signals are read out of PROM 19 for only every other (i.e., for only six) channels to generate RF filter tuning control signals VT1 and VT2 from the local oscillator control signal VT. This is indicated by waveforms 35 and 36. VT1 comprises three straight line segments of different slope for tuning channels 2–6 and VT2 comprises four straight line segments of different slope for tuning channels 7–13.

Due to the closer similarity of the frequency ranges of VCO 9 and RF stage 12 and the wider bandwidth of RF stage 12 as a result of its higher frequency, the degree of modification required of the LO tuning signal VT for deriving the UHF filter control signal VT3 is less than that required for deriving the VHF filter control signals VT1 and VT2. Therefore, a double pole, single throw switching arrangement of addressing circuit 20, in response to the VB3 bandswitching signal which indicates that the selected channel is in the UHF tuning range, decouples the remaining three least significant bits of the BCD signals representing the units digit of the channel number and the first least significant bit of the binary signals representing the tens digit of the channel number from address inputs (a)–(d) of PROM 19 and instead couples the four bits of the BCD signals representing the tens digit of channel number to address inputs (a)–(d) of PROM 19 and couples a logic high level to address input (e) of PROM 19. In this manner, for the seventy possible channels which can be selected in the UHF tuning range, PROM 19 is only presented with eight unique addresses and is therefore required to have only eight memory locations for storing the adjustment signals for UHF channels 14–83. Thus, for the FIG. 1 tuning system, PROM 19 only requires 15 memory locations, 7 for VHF channels and 8 for UHF channels.

Figure 2:
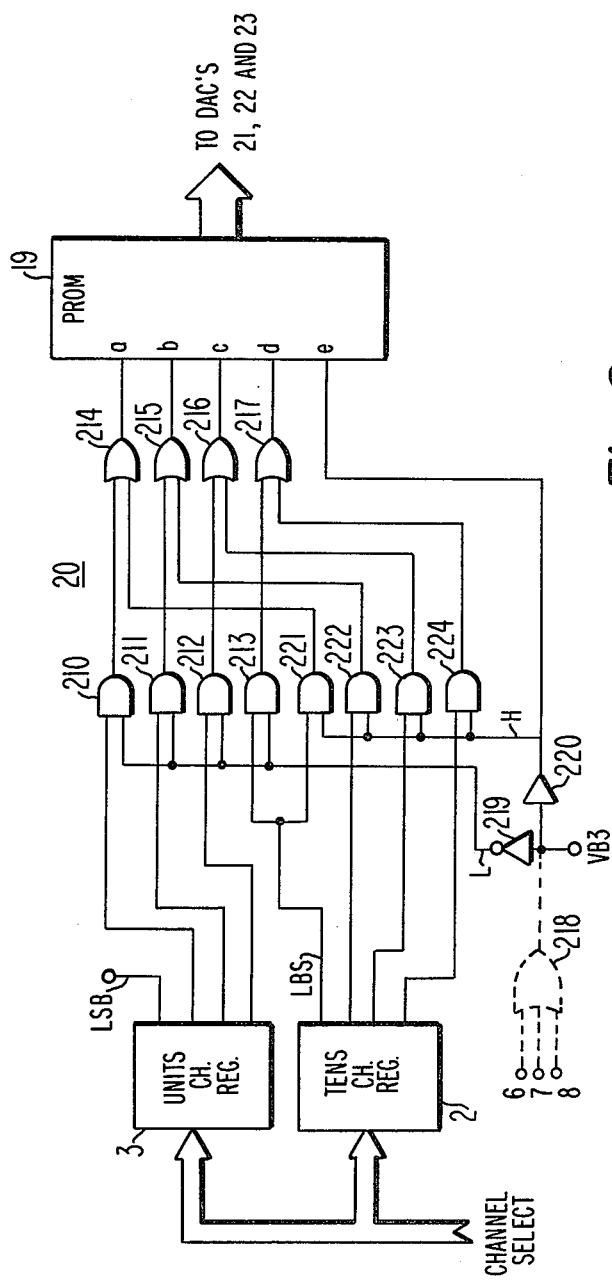
FIG. 2 illustrates, in block diagram form, an embodiment of the memory addressing portion shown in FIG. 1.

FIG. 2 illustrates, in logic diagram form, a circuit for accomplishing the switch functions of addressing circuit 20. AND gates 210, 211, 212 and 213 apply the three most significant bits (MSB's) of the units BCD channel number representative signals and the first least significant bit (LSB) of the tens BCD channel number representative signals to address inputs a, b, c and d respectively, of PROM 19 via OR gates 214, 215, 216 and 217, respectively. Note, the first least significant bit (LSB1) of the units BCD signals is not applied to address input a, resulting in a grouping of addresses for each two adjacent channel numbers. The VB3 bandswitch signal is applied to the input of an inverter 219 to develop a low logic level signal L for disabling the operation of AND gates 210–213 and applied to a buffer 220 to develop a high logic level signal H for enabling AND gates 221, 222, 223 and 224. As a result, AND gates 210, 211, 212 and 213 decouple the three MSBs of the units BCD signals and the first LSB of the tens BCD signals from address inputs a, b, c and d, respectively, of PROM 19 and AND gates 221, 222, 223 and 224 instead apply the four tens BCD signals to address inputs a, b, c and d of PROM 19, respectively, via OR gates 214, 215, 216 and 217, respectively. The logic H signal is applied to address input e.

Instead of applying bandswitching signal VB3 to inverter 219 and buffer 220 an OR gate 218, shown in phantom, responsive to the three MSB's of the tens BCD signals can be used for providing an input to inverter 219 and buffer 220. With this alternative arrangement, groups of two adjacent channel numbers will use the same memory location for channel numbers 2 through 19 and groups of ten adjacent channel numbers will use the same memory location for channel numbers 20 through 83.

Figure 3:
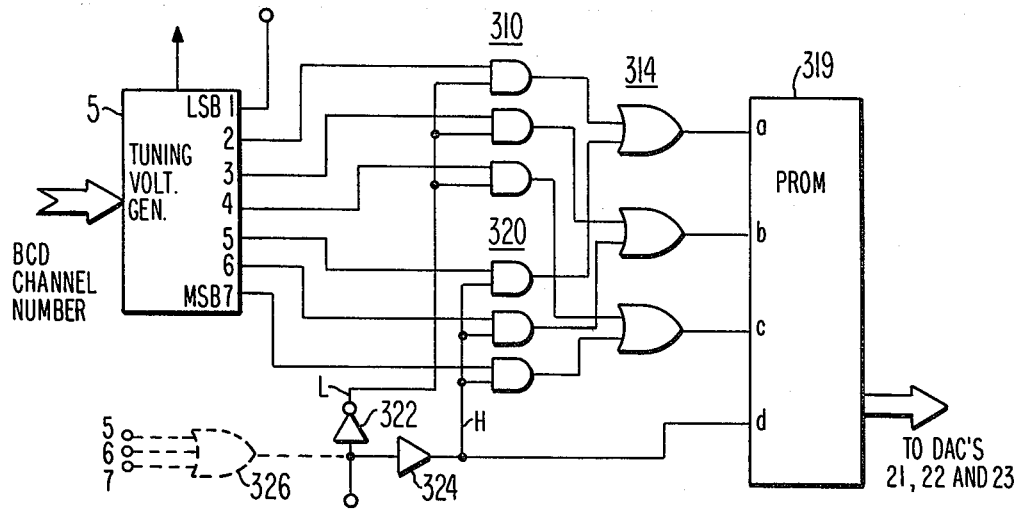
FIG. 3 illustrates, in block diagram form, an alternative embodiment of the memory addressing portion shown in FIG. 1.

In an alternative embodiment of the tuning system shown in FIG. 1, tuning voltage generator 5 may provide a straight-binary code representation of the selected channel number. In this case, an arrangement as shown in FIG. 3 may be used to provide grouping of adjacent channel numbers for addressing the memory locations of the PROM. Tuning voltage generator 5 provides a seven-bit straight-binary signal corresponding to the selected channel number. LSB1 of the binary channel number representative signals is not used for addressing PROM 319. The next three LSB's (2, 3 and 4) are coupled via AND gates 310 and OR gates 314 to address inputs a, b and c of PROM 319. PROM 319 is similar in construction and operation to PROM 19 of the previous FIGURES, however, its memory locations are able to be addressed by a four-bit straight binary code, and may be of the type X2210 manufactured by Xicor, Inc., Milpitas, Calif. The VB3 bandswitch signal is applied to an inverter 322 to develop a low logic level L signal for disabling AND gates 310 and a buffer 324 to develop a high logic level H signal for enbling AND gates 320 and for application to address input d. When the VB3 bandswitching signal is present, the three LSBs (2, 3 and 4) previously coupled to address inputs a, b and c are decoupled and instead the three MSB's (5, 6 and 7) of the binary channel number representative signals are coupled to address inputs a, b and c respectively, via OR gates 314.

With this arrangement, for channel numbers in the VHF band, groups of two adjacent channel numbers use the same memory location of PROM 319. For channel numbers in the UHF band, groups of 16 adjacent channel numbers use the same memory location.

Alternatively, an OR gate 326, shown in phantom, responsive to the three MSB's (5, 6 and 7) of the binary channel number representative signals can be used for providing the input to inverter 322 and buffer 324. With this arrangement, groups of two adjacent channel numbers would share the same memory location for channel numbers 2 through 15 and groups of 16 adjacent channel numbers would share the same memory location for channel numbers 16 through 83.

Figure 4:
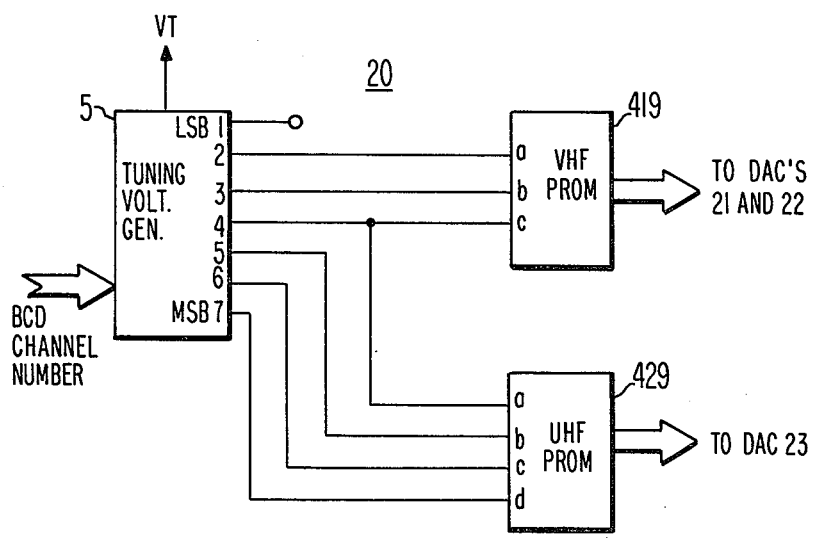
FIG. 4 illustrates, in block diagram form, another alternative embodiment of the addressing portion of the tuning system of FIG. 1.

FIG. 4 shows an embodiment of an addressing circuit where separate memories are used for the VHF and UHF bands. By way of example, the channel number is represented in straight-binary code as in FIG. 3. In FIG. 4, address circuit 20 comprises a coupling path for applying least significant bits 2–4 of the straight-binary channel number representative signals to the address inputs of the straight-binary addressed PROM 419 for storing adjustment signals for pairs of adjacent channel numbers for the channel numbers between 2 and 15 and most significant bits 4–7 of the straight-binary channel number representative signals to the address inputs of a straight-binary addressed PROM 429 for storing adjustment signals for groups of sixteen adjacent channel numbers for channel numbers between 16 and 83.

While the present invention has been described within a single conversion tuning system in which received RF signals are heterodyned once to a conventional IF frequency, it could be equally satisfactorily employed in a double conversion tuning system in which the received RF signals are heterodyned twice, i.e., by a first mixer to a IF frequency substantially higher than the standard IF frequency and then by a second heterodyning stage to the standard IF frequency.

Moreover, the invention is also applicable to tuning systems such as those that receive channels in various cable bands as well as those in the broadcast bands and addressing circuit 20 can cause the address input of PROM 19 to be nonresponsive to increasing numbers of least significant bits in accordance with the band selected. For example, with reference to FIG. 1, the switch arrangement of addressing circuit 20 can cause the address inputs of PROM 19 to be unresponsive to the first LSB of a binary channel number code for channels in the low VHF band and a first cable band; unresponsive to the first and second LSB's of a binary channel number code for channels selected in the high VHF and a second cable band and unresponsive to the three LSB's of a binary channel number code for channels selected in the UHF television tuning band.

Furthermore, the circuit structure of the programmable attenuators and addressing circuit 20 can be included on the same substrate as the PROM integrated circuit, thus reducing manufacturing cost. These and other modifications of this nature are considered to be within the scope of the invention defined by the following claims.

What is claimed is:

1. In a tuning system for a receiver including an RF filter means for selecting RF signal corresponding to respective selected channels in response to a filter tuning control signal, a local oscillator for developing a local oscillator signal and controlling its frequency in response to an oscillator tuning control signal, channel selection means for generating binary coded signals representing channel numbers of selected channels, local oscillator control means for generating said oscillator control signal in response to said binary coded channel number representative signals and a mixer for heterodyning said selected RF signal with said oscillator signal for frequency translating said selected RF signal to a predetermined intermediate frequency (IF); means for generating said filter tuning control signal comprising:

memory means having a plurality of memory locations with unique addresses, each memory location storing and developing, when addressed, binary coded signals representing a component of said filter tuning control signal;

combining means responsive to said binary coded signals representing said component of said filter tuning control signal and to said oscillator tuning control signal for developing said filter tuning control signal;

means for addressing said memory locations in response to said channel number representative binary signals including coupling means for supplying only preselected ones of said channel number representative binary coded signals to address inputs of said memory means, said coupling means selectively increasing the numbers of least significant bits of said binary coded channel number representative signals not coupled to said address inputs as said channel numbers increase.

2. The tuning system of claim 1 wherein said coupling means comprises an array of logic gates for coupling a group of least significant bits of said channel number representative binary coded signals to said address inputs of said memory means when the channel number of said selected channel is equal to or less than a predetermined number, and for coupling a group of most significant bits of said channel number representative binary coded signals address inputs of said memory when the channel number of a selected channel is greater than said predetermined number.

3. The tuning system of claim 2 wherein said channel number representative binary coded signals comprises four bits representing the units digit of the channel number of the selected channel and four bits representing the tens digit of the channel number of said selected channel, said coupling means supplying the three most significant bits of said units digit representative bits and the first least significant bit of said tens digit representative bits to said address inputs when said selected channel is equal to or less than said predetermined number, and supplying the four most significant bits of said tens digit representative bits to said address inputs when said selected channel is greater than said predetermined number.

4. The tuning system of claim 3 wherein said predetermined number is thirteen.

5. The tuning system of claim 3 wherein said predetermined number is nineteen.

6. The tuning system of claim 2 wherein said channel numbers are represented in straight-binary code comprising a first group of bits including at least the least significant bit, a second group of bits including the most significant bit and a third group of bits including bits intermediate said least and most significant bits, said coupling means supplying said second group of bits to said address inputs when the channel number of said selected channel is greater than said predetermined number, supplying said third group of bits to said address inputs when the channel number of said selected channel is equal to or less than said predetermined number, and not coupling said first group of bits to said address input for any selected channel.

7. The tuning system of claim 6 wherein said predetermined number is thirteen.

8. The tuning system of claim 6 wherein said predetermined number is fifteen.

9. The tuning system of claim 2 wherein said coupling means is responsive to a band switch signal generated by said local oscillator control means for determining the number of bits of said channel number representative binary coded signals which are supplied to address inputs of said memory means.

10. The tuning system of claim 1 wherein said memory means includes first and second memories associated with respective first and second tuning ranges, said second tuning range being a higher frequency tuning range than said first tuning range, each of said memories having respective address inputs, said coupling means coupling preselected ones of the least significant bits of said channel number representative binary coded signals to said address inputs of said first memory and coupling preselected ones of most significant bits of said channel number representative binary coded signals to said address inputs of said second memory.

11. The tuning system of claim 10 wherein said first tuning range is the VHF tuning range and said second tuning range is the UHF tuning range.

12. The tuning system of claim 1 wherein said combining means includes a programmable signal divider for providing a programmable fraction of said oscillator tuning control signal as said filter tuning control signal in response to said binary coded signals stored in said memory means.

* * * * *